(12) United States Patent
Rauenbusch et al.

(10) Patent No.: US 9,222,192 B2
(45) Date of Patent: Dec. 29, 2015

(54) HOLDING DEVICE FOR A PRODUCT AND TREATMENT METHOD

(71) Applicant: Atotech Deutschland GmbH, Berlin (DE)

(72) Inventors: Ralph Rauenbusch, Neumarkt (DE); Christian Thomas, Erlangen (DE); Ray Weinhold, Nürnberg (DE); Heinz Klingl, Neusäβ (DE)

(73) Assignee: Atotech Deutschland GmbH, Berlin (DE)

( * ) Notice: Subject to any disclaimer, the term of this patent is extended or adjusted under 35 U.S.C. 154(b) by 0 days.

(21) Appl. No.: 14/427,045

(22) PCT Filed: Sep. 16, 2013

(86) PCT No.: PCT/EP2013/069117
§ 371 (c)(1),
(2) Date: Mar. 10, 2015

(87) PCT Pub. No.: WO2014/053300
PCT Pub. Date: Apr. 10, 2014

(65) Prior Publication Data
US 2015/0225868 A1 Aug. 13, 2015

(30) Foreign Application Priority Data
Oct. 2, 2012 (DE) .................. 10 2012 019 389

(51) Int. Cl.
*C25D 17/00* (2006.01)
*C25D 5/02* (2006.01)
*C25D 17/06* (2006.01)
*C25D 7/12* (2006.01)
*H05K 3/00* (2006.01)

(52) U.S. Cl.
CPC *C25D 17/06* (2013.01); *C25D 7/12* (2013.01); *C25D 17/001* (2013.01); *C25D 17/004* (2013.01); *H05K 3/007* (2013.01); *Y10T 29/49117* (2015.01)

(58) Field of Classification Search
CPC .... C25D 17/001; C25D 17/004; C25D 17/06; C25D 7/12; H01L 21/02104–21/02697; H01L 21/67–21/683; H05K 3/007; H05K 3/0085; H05K 3/188; H05K 3/46
USPC .............. 204/297.01, 297.02, 297.03, 297.15
See application file for complete search history.

(56) References Cited

U.S. PATENT DOCUMENTS

| 6,887,113 B1 | 5/2005 | Langheinrich |
| 2004/0022940 A1 | 2/2004 | Nagai et al. |

(Continued)

OTHER PUBLICATIONS

PCT/EP2013/069117; PCT International Search Report and Written Opinion of the International Searching Authority dated Dec. 13, 2013.

*Primary Examiner* — Luan Van
*Assistant Examiner* — Alexander W Keeling
(74) *Attorney, Agent, or Firm* — Renner, Otto, Boisselle & Sklar, LLP

(57) ABSTRACT

A holding device for a treatment of a product (5), which holding device comprises a first holding part (41) and a second holding part (42). The first holding part (41) comprises at least one first electrical contact element (13) for establishing a contact with a first side (6) of the product (5). The second holding part (42) comprises at least one second electrical contact element (14) for establishing a contact with a second side (7) of the product (5), which second side that lies opposite the first side (6). The first holding part (41) and the second holding part (42) are arranged in such a way that they can be fastened to one another in a detachable manner for the purpose of holding the product (5). A product seal (15, 16) and a housing seal (17) provide a sealing arrangement to prevent the penetration of fluid into the at least one first electrical contact element (13) and the at least one second electrical contact element (14) in a treatment state.

18 Claims, 10 Drawing Sheets

(56) References Cited

U.S. PATENT DOCUMENTS

2004/0037682 A1* 2/2004 Yoshioka ............... C25D 17/06
                                                              414/458
2006/0076241 A1   4/2006 Schneider et al.
2010/0200410 A1   8/2010 Schneider et al.
2012/0043200 A1   2/2012 Fujikata et al.
2014/0024178 A1*  1/2014 Scanlan .................. H01L 21/56
                                                              438/127

* cited by examiner

HOLDING DEVICE FOR A PRODUCT AND TREATMENT METHOD

The present application is a U.S. National Stage Application based on and claiming benefit and priority under 35 U.S.C. §371 of International Application No. PCT/EP2013/069117, filed 16 Sep. 2013, which in turn claims benefit of and priority to German Application No. 10 2012 019 389.0 filed 2 Oct. 2012, the entirety of each of which is hereby incorporated herein by reference.

The invention relates to a device and a method for galvanically treating, in particular galvanically coating, a planar product, for example wafers in order to produce semiconductor elements, printed circuit boards or foils or other planar products to be treated. The product can be provided for example in a circular or rectangular form.

In order to treat the product in a galvanic manner, said product is placed in an electrolyte bath that is located in a treatment container. Anodes are arranged in the treatment container for the galvanic coating. Metal is deposited on the product in a galvanic manner by virtue of applying a voltage between the anodes and the product. Holding devices are used for the product that is to be treated in order to render possible an as large as possible range of use of the product, said holding devices holds the product in a border area. It is desirable that the product can be partially or entirely automatically fastened to and released from the holding device.

Different applications can require that both sides of the product are treated galvanically. Although the two sides can be coated sequentially using different coating processes, it is desirable to coat both sides of the product simultaneously for example in order to carry out the method efficiently. Furthermore, it can be necessary to treat only one side of two products simultaneously.

There is a need for holding devices and methods for galvanically treating a product, which holding devices and methods provide advantages with respect to the above mentioned aims. There is in particular a need for holding devices and methods for treating a product, which holding devices and methods are arranged for the purpose of coating both sides of the product simultaneously.

This object is achieved by a holding device and a method having the features disclosed in the independent claims. Further exemplary embodiments are defined in the dependent claims.

A holding device for treating the product comprises a first holding part and a second holding part. The first holding part comprises at least one first electrical contact element for establishing a contact with the first side of the product. The second holding part comprises at least one second electrical contact element for establishing a contact with a second side of the product, which second side lies opposite the first side. The first holding part and the second holding part are arranged in such a way that they can be fastened to one another in a detachable manner for the purpose of holding the product. Prior to the treatment, the product is placed in the opened holding device, preferably in the first holding part and the holding device is subsequently closed by way of connecting the second holding part to the first holding part and the product is thus held in place. The treatment can then be performed. Following the treatment, the holding device is opened by removing the second holding part from the first holding part and the product is removed from the opened holding device. The working steps can be automated more easily by way of a simple construction of the holding device with the first and second holding parts, by means of which holding parts the holding device is closed or opened and the product is placed in the holding device. In a treatment state, if the first holding part and the second holding part are fastened together and they hold the product between said holding parts, a product seal and a housing seal provide a sealing arrangement to prevent the penetration of fluid into the at least one first electrical contact element and the at least one second electrical contact element. The product seal can produce a sealing arrangement on both sides of the product with respect to the holding device. The product seal prevents liquid from penetrating the holding device. Such a holding device is particularly suitable for being used for depositing a metal simultaneously on both sides of the product by making use of electrical contact elements that simultaneously contact the opposite-lying sides of the product in an electrical manner.

The product seal is positioned in such a manner that it lies against the product that is being held by the holding device. The product seal can create a sealing arrangement both between the first holding part and the product as well as between the second holding part and the product. The housing seal is positioned in such a manner that in a treatment state it provides a sealing arrangement between the first holding part and the second holding part.

The first holding part can comprise a plurality of first electrical contact elements that are arranged around a middle opening of the holding device. The second holding part can comprise a plurality of second electrical contact elements that are arranged around the middle opening. The first electrical contact elements and the second electrical contact elements can lie in the treatment state against the product in a resilient manner. The product seal can extend around the middle opening. The housing seal can extend around the middle opening and the product seal. In the treatment state, the product seal and the housing seal can provide an annular sealed region, in which the first electrical contact elements and the second electrical contact elements are arranged. In an advantageous embodiment, the product seal follows the contour of the product and/or the housing seal follows the exterior contour of the holding device.

The holding device can comprise a device for exerting a force, which device is arranged for the purpose of fastening the first holding part and the second holding part to one another.

The device for exerting the force can be provided as a mechanical locking mechanism. The holding device can be arranged in such a manner that when the locking mechanism is in the locked state, as little movement as possible of the at least one first electrical contact element and the at least one second electrical contact element is generated relative to the product in a direction parallel to the surface of the product. The second holding part can comprise a locking element that can move relative to the at least one second electrical contact element. The locking element can be rotated or displaced relative to the at least one second electrical contact element.

The device for exerting the force can also comprise at least one hollow chamber and a vacuum power source in order to connect the two holding parts to one another by way of an applied vacuum. At least one wall of the hollow chamber is provided by the first holding part, and at least one further wall of the hollow chamber is provided by the second holding part. The holding part can comprise a third seal between the product seal and the housing seal, which third seal in the treatment state prevents gas and/or the treatment fluid from flowing into the hollow chamber, therefore preserving the vacuum during the treatment. The holding device can also comprise a third and fourth seal, wherein the third and fourth seal prevent fluids, in particular gas and/or the treatment fluid, from flowing into the hollow chamber, therefore preserving the vacuum during the treatment.

The device for exerting the force can comprise at least one magnet, in particular a permanent magnet. At least one permanent magnet can be embedded in the first holding part and at least one further permanent magnet can be embedded in the second holding part. A plurality of permanent magnets can be arranged around a middle opening of the first holding part in the first holding part and/or around a middle opening of the second holding part in the second holding part. It is also possible to provide one holding part having permanent magnets and the other holding part having material that can be magnetised. In addition to the permanent magnet, at least one electromagnet can be arranged on the first holding part and/or the second holding part. The electromagnet can be arranged in such a manner that the magnetic force is reduced by way of generating a current flow in the electromagnet. This renders possible a simpler process of opening and closing of the holding device.

The first holding part and the second holding part can be connected to one another in an electrically conductive manner. One of the holding parts can comprise an electrical connector element in order to connect it to a current or voltage supply. The first holding part and the second holding part can comprise electrical conductors that in the treatment state connect the at least one first electrical contact element and the at least one second electrical contact element to the connector element in an electrically conductive manner. The first holding part can comprise a first conductive, in particular metal, body and the second holding part can comprise a second conductive, in particular, metal body, which bodies lie in a planar manner one against the other in the treatment state. In the treatment state, the contact surface of the first conductive body and the second conductive body can be arranged between the product seal and the housing seal. The first holding part and the second holding part can lie against one another along their conductive surfaces in particular if the described magnetic force or vacuum force are used, by way of the device for exerting the force, in order to transmit current from one holding part to the other holding part, without the need to press the holding parts against one another by means of resilient elements.

The product seal can comprise one first sealing lip that is attached to the first holding part and a second sealing lip that is attached to the second holding part.

The holding device can be arranged as a wafer holder.

In accordance with a further exemplary embodiment a system is disclosed that comprises a treatment container and a holding device in accordance with an exemplary embodiment.

A method for treating a product comprises fastening the product to a holding device that comprises a first holding part having at least one first electrical contact element and a second holding part having at least one second electrical contact element. The first holding part and the second holding part are fastened to one another in such a detachable manner that the first electrical contact element lies against a first side of the product, that the second electrical contact element lies against a second side of the product, which second side lies opposite the first side, and that a product seal and a housing seal provide a sealing arrangement to prevent the penetration of fluid into the at least one first electrical contact element and the at least one second electrical contact element. The product that is held by the holding device is treated with a treatment fluid.

During the method, the first side and the second side can be galvanically treated simultaneously.

The holding device together with the product that is held by said holding device can be moved relative to electrodes that are arranged in a galvanic bath. The method can comprise placing the product against the first holding part and fastening the second holding part to the first holding part in a detachable manner, wherein these steps are mechanically and automatically implemented. The method can comprise the step of mechanically opening the holding device following the treatment.

Further features of the method correspond to the features of the holding device in accordance with exemplary embodiments. The method can be implemented by means of the device in accordance with an exemplary embodiment.

The holding device and the method can be used to galvanically coat a planar product, by way of example a wafer.

The invention is further explained hereinunder with reference to preferred or advantageous exemplary embodiments with reference to the attached drawings.

Figure 1:
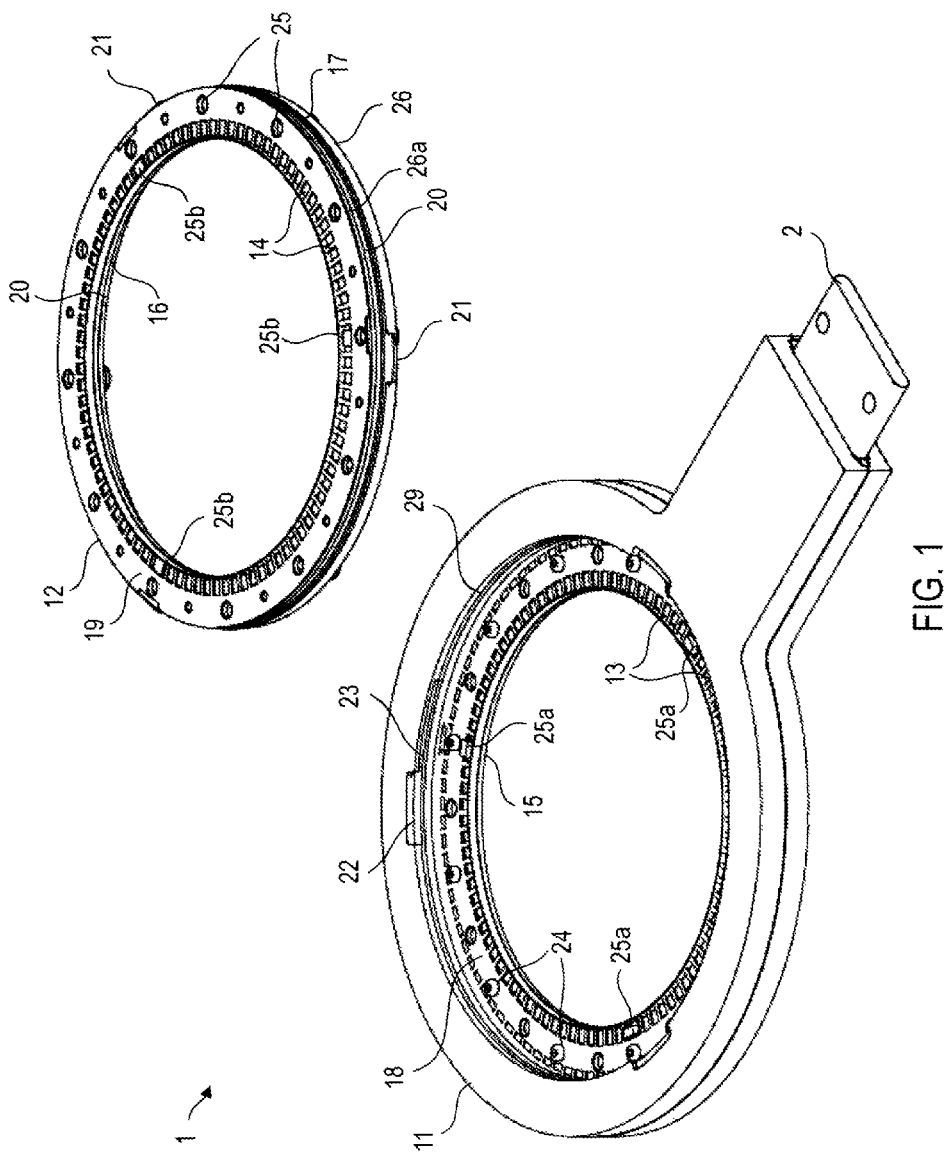
FIG. 1 is a perspective view of a holding device in accordance with an exemplary embodiment.

The exemplary embodiments are described in the context of methods for galvanically coating a product that is submerged in a galvanic bath. The product can comprise two electrically conductive surfaces. While exemplary embodiments are described in the context of wafer holders, the holding devices and methods can also be used to treat other products. In the figures, identical reference numerals refer to identical elements.

Figure 2:
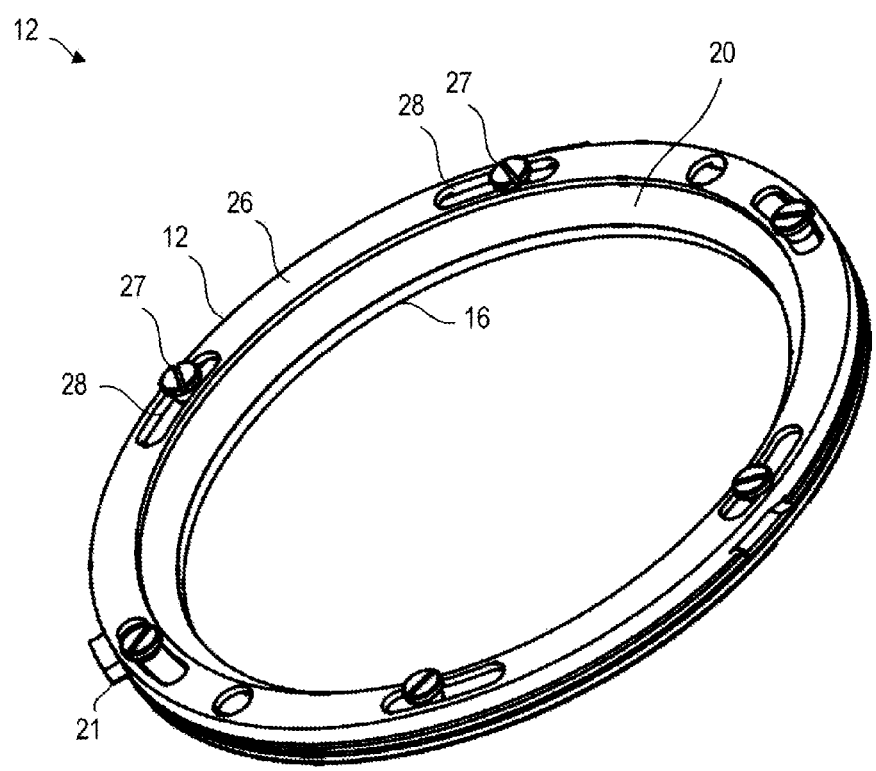
FIG. 2 is a perspective view of a second holding part of the holding device as shown FIG. 1.
Figure 3:
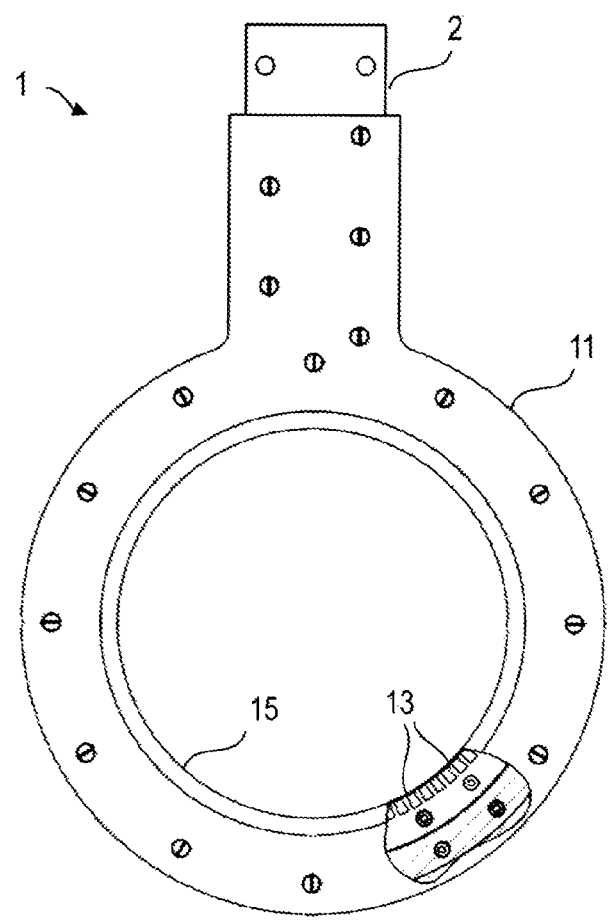
FIG. 3 is a partially exploded plan view of the holding device as shown in FIG. 1.
Figure 4:
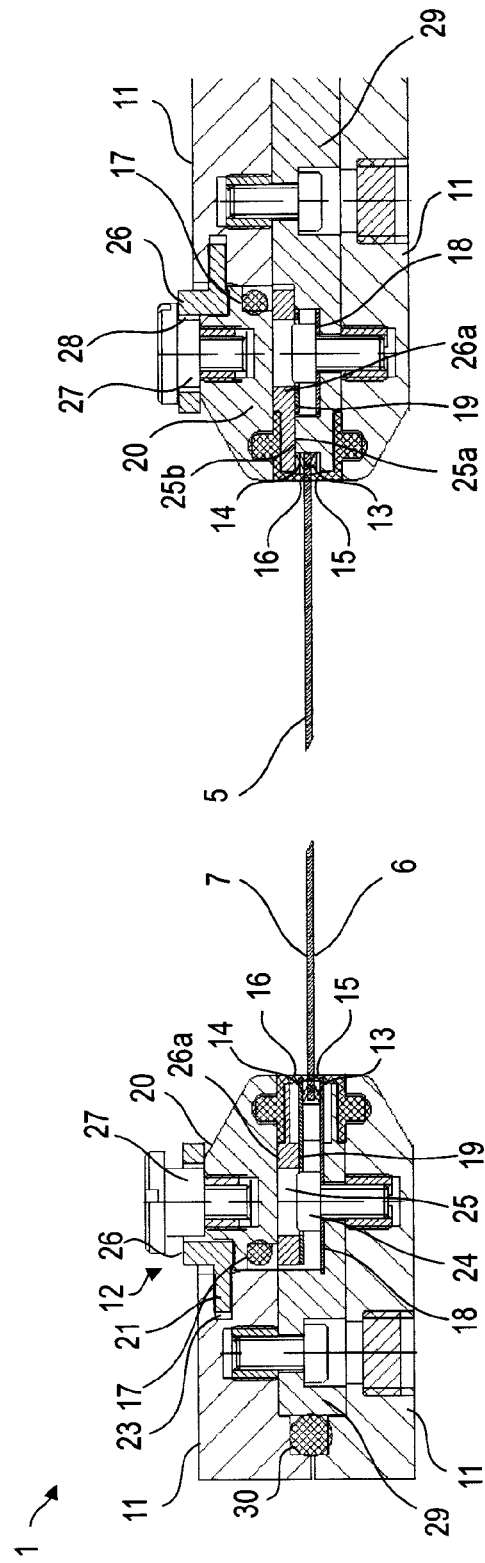
FIG. 4 is a sectional view of the holding device as shown in FIG. 1 in the treatment state.

FIG. 1 is a perspective view of a holding device 1 in accordance with an exemplary embodiment in an opened state, FIG. 2 is an enlarged perspective view of a second holding part of the holding device 1, FIG. 3 is a partially exploded plan view and FIG. 4 is a sectional view in the treatment state. The holding device 1 comprises a first holding part 11 and a second holding part 12. The first holding part 11 and the second holding part 12 can be fastened to one another in a detachable manner by way of a mechanical locking mechanism. The product is held between the first holding part 11 and the second holding part 12 in such a manner that contact is established with only a border area of the holding device 1 and the product is contacted in this area in an electrical manner on both sides. A treatment area of the product extends into the middle opening of the first holding part 11 and the second holding part 12. The second holding part 12 can be installed in the first holding part 11. The middle opening of the first holding part 11 and the second holding part 12 can be of a circular shape.

The first holding part 11 comprises first electrical contact elements 13 for the purpose of contacting the product on its first side. The first electrical contact elements 13 can be provided as resilient contact fingers that are pre-stressed against the product 5 that is being held by the holding device 1. The first electrical contact elements 13 can comprise in each case a fundamentally planar portion, to which an end section extends that is inclined or curved in the direction of the product 5, which end section contacts the product. The first electrical contact elements 13 can be arranged in a circular ring around the middle opening. The first electrical contact elements 13 can be attached to a contact frame, in particular a contact ring. The second holding part 12 comprises second electrical contact elements 14 for the purpose of contacting the product on its second side. The second electrical contact elements 14 can be provided as described for the first electrical contact elements 13, in other words they can be provided as resilient contact fingers that are pre-stressed against the product 5 that is being held by the holding device 1. The second electrical contact elements 14 can comprise in each case a fundamentally planar portion, to which an end section extends that is inclined or curved in the direction of the product, which end section contacts the product. The second electrical contact elements 14 can be arranged in a circular ring around the middle opening. The second electrical contact elements 14 can be attached to a further contact frame, in particular a contact ring. The first and second electrical contact elements can also hold the product 5 by means of mechanical means.

The first holding part 11 comprises a first sealing lip 15 of a first seal, which is also described as a product seal hereinunder. The second holding part 12 comprises a second sealing lip 16 of the product seal. In a treatment state, in which the holding device 1 holds the product 5, the first sealing lip 15 and the second sealing lip 16 lie against the opposing sides 6, 7 of the product 5 and seal the volume in which the first and second electrical contact elements 13, 14 are arranged, preventing a penetration of treatment fluid. A second seal that is also described as a housing seal 17 can be provided on the first holding part 11 and/or on the second holding part 12. The housing seal 17 in conjunction with the product seal 15, 16 seals the region in which the first and second electrical contact elements 13, 14 are arranged, preventing a penetration of treatment fluid. The exterior seal 30 seals two housing parts of the first holding part with respect to one another. Said seal can fundamentally extend (in the case of some exemplary embodiments, to more than 80% of its total length) in an exterior border area (in the case of some exemplary embodiments, a region of the exterior 20 mm of the first holding part), in order to minimise the amount of fluid diverted by way of gaps between the housing parts of the first holding part. The sealing lips 15, 16 of the product seal and the housing seal 17 comprise of an elastic material.

An electrical connector element 2 can be attached to the first or second holding element. The holding device 1 comprises electrical conductors that are integrated in the holding parts, which conductors connect the connector element 2 to a metal body 29 in the treatment state, in order to render it possible to supply a current to the first electrical contact elements 13 and the second electrical contact elements 14. The first holding part 11 can comprise a metal body 29 that is embedded therein, which body is connected to the connector element 2 and the first electrical contact elements 13 in an electrically conductive manner. A conductive connection to the second electrical contact elements 14 can be produced by way of conductive resilient elements (not illustrated) that are located between the contact rings 18 and 19. The contact elements 13 and 14 are located on the corresponding contact rings 18 and 19. As a consequence, the same electrical potential can be applied to both sides of the product.

In order to hold the second holding part 12 against the first holding part 11, the holding device comprises a locking mechanism. The locking mechanism can be provided in such a manner that it exerts a force that presses the holding parts against one another. The locking mechanism can comprise protrusions 21 on one of the holding parts, for example on the second holding part 12, which protrusions can be positioned in corresponding receiving devices 23 on the other holding part. The protrusions 21 can be initially inserted into the openings 22 in order to fasten the holding parts in a detachable manner. The protrusions 21 can be moved into the receiving devices 23 by way of a rotational movement. The receiving device 23 can be formed in the circumferential direction in such a manner that the second holding part 12 initially has to be pushed further in the direction towards the first holding part 11, in order to render possible a movement of the protrusions 21 into the receiving devices 23 and then back a little away from the first holding part 12.

The locking mechanism is provided in such a manner that during the process of closing and opening the holding device there is no relative movement between those portions of the holding parts that lie directly against the product and the product itself. For this purpose, the second holding part 12 can comprise a plurality of components that move relative to one another. The second holding part 12 can comprise a locking ring 26, to which the protrusions 21 are attached and which locking ring can be rotated and/or displaced relative to the second sealing lip 16 and the second electrical contact elements 14. The sealing lip 16, the contact ring 19 having the second electrical contact elements 14 and a support ring 26a can be connected to a covering ring 20 of the second holding part 12 in a non-rotatable manner. Guiding elements 27 are located on the covering ring 20, which guiding elements together with the slots 28 in the closing ring 26 define the path for the rotation of the closing ring relative to the covering ring 20.

In order to close the holding device 1 after installing the product 5 and positioning the second holding part 12 in such a manner that the protrusions 21 are inserted into the openings 22, a force is applied to the guiding elements 27 in a perpendicular direction with respect to the product plane. As a consequence, the second holding part 12 is moved into the first holding part 11 until the distance elements 25a lie against a holding part 11, 12 on limiting surfaces 25b on the other holding part 11, 12. The elements 25a and 25b limit the maximal stroke when lowering the holding part 12. As a consequence, only a defined maximum force is exerted on the product by way of the contact elements 13, 14, even if an automatic closing mechanism provides a greater force. Subsequently, the closing ring can be rotated using a small amount of force, since the receiving devices 23 have sufficient play with respect to the protrusions 21. Afterwards, the perpendicular force on the guiding elements 27 is removed and the product is held in the holding device ready to be treated. A lock against rotation can be established to prevent a relative movement between the product seal and the contact elements on the one hand and the product on the other hand by way of locking elements 24 that engage in cut-outs 25 on the holding part 11, 12. The locking elements 24 can simultaneously fasten the contact ring 18 to the first electrical contact elements 13 on the first holding part 11. The distance elements 25a can be used simultaneously in order to centre the product as it is being placed into the holding part 11, 12. Said distance elements are arranged around the product 5.

The holding device 1 is opened in a reverse manner, in other words by way of applying the perpendicular force to the guiding elements 27 using a force direction that is perpendicular with respect to the product plane, by way of reverse-turning and/or unlocking the closing ring 26, terminating the perpendicular force, removing the second holding part 12 from the first holding part 11 and removing the product 5 from the first holding part 11.

The holding device 1 is provided in such a manner that in the treatment state the electrically conductive components of the holding device, which components are connected to the connector element 2 in an electrically conductive manner do not come into contact with the treatment fluid. The holding device 1 can comprise components of insulating material on the exterior surfaces and/or comprise an insulating coating. As is illustrated for example in the sectional view in FIG. 4, the first housing part can comprise a metal body 29, the exterior of which is surrounded by insulating components. The housing seal 17 together with a further seal 30 can seal the metal body 29 in order to prevent an inflow of the treatment fluid.

As can also be seen in the sectional view in FIG. 4, the opposite lying sides 6, 7 of the product 5 can be contacted in an electrical manner by means of the first electrical contact elements 13 and the second electrical contact elements 14. The region, in which the first electrical contact elements 13 and the second electrical contact elements 14 are arranged is sealed by way of the product seal having the sealing lips 15, 16 and the housing seal 17 in order to prevent penetration of fluid from the exterior.

Alternatively or in addition to a mechanical locking mechanism, a force for the purpose of fastening the holding parts to one another can also be generated in another manner.

Figure 5:
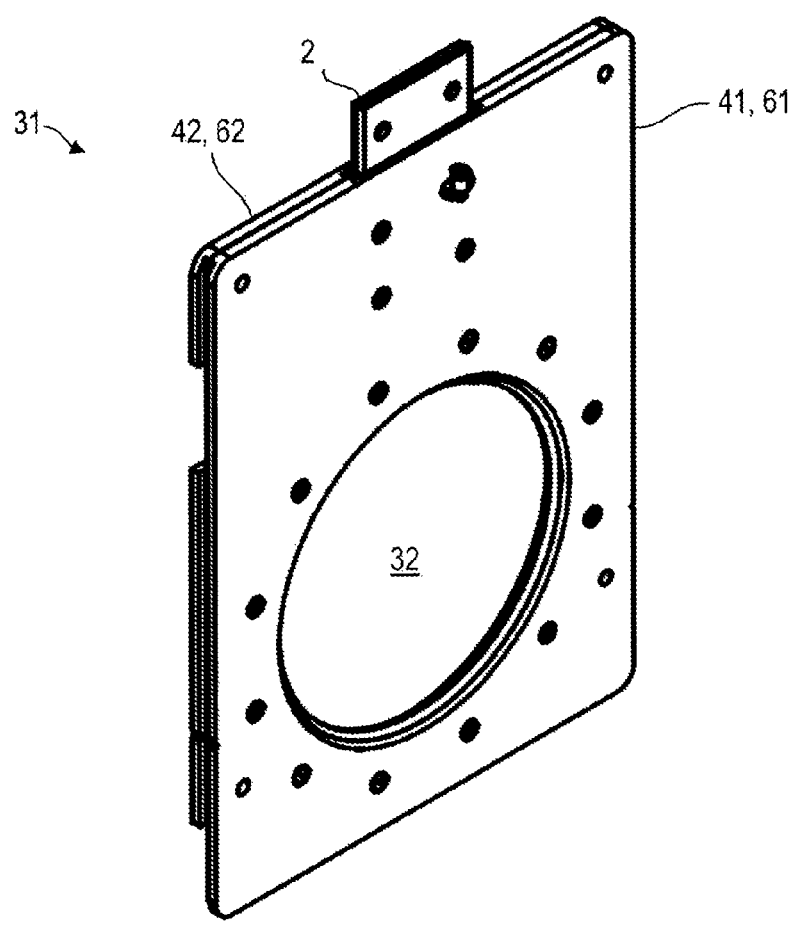
FIG. 5 is a perspective view of a holding device in accordance with an exemplary embodiment.

FIG. 5 is a perspective view of a holding device 31 in the closed state. The product 5 can extend in the middle opening 32. The holding device 31 can comprise two holding parts 41, 42 that are fastened to one another by way of generating a vacuum in a hollow chamber. Embodiments of holding parts 41, 42 of this type are further described with reference to the sectional views shown in FIG. 6 and FIG. 7. The holding device 31 can comprise two holding parts 61, 62 that are fastened to one another by way of magnetic forces. Embodiments of holding parts of this type 61, 62 are further described with reference to FIG. 8 and FIG. 9. In the case of the holding devices that are described with reference to FIG. 5 to FIG. 9, the holding parts comprise electrical contact elements that can be provided as described with reference to FIGS. 1 to 4. The holding device further comprises a product seal and a housing seal, as is described in reference to FIGS. 1 to 4.

Figure 6:
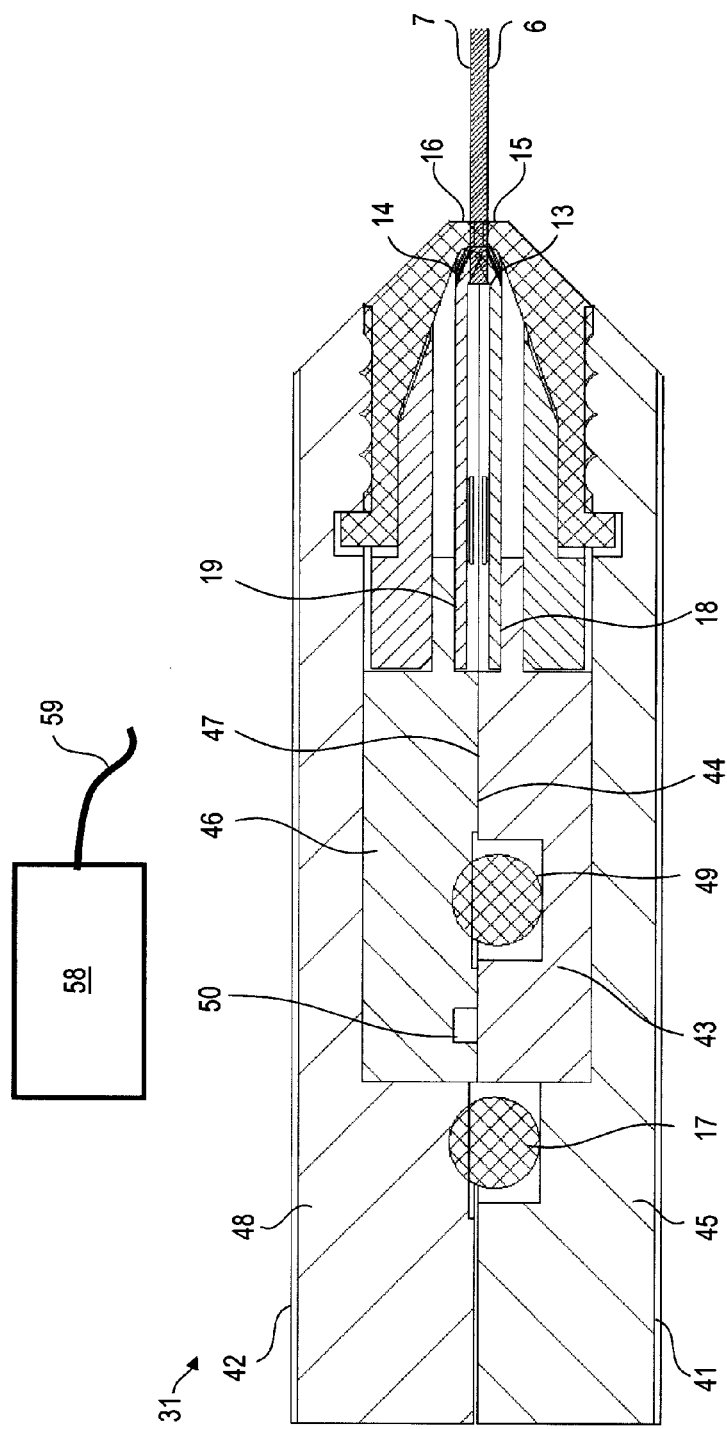
FIG. 6 is a partial sectional view of a holding device in accordance with an exemplary embodiment in the treatment state.

FIG. 6 is a partial sectional view that illustrates the holding device 31 having a first holding part 41 and a second holding part 42 in a border area of the product 5. First electrical contact elements 13 contact a first side 6 of the product. Second electrical contact elements 14 contact a second side 7 of the product. The first and second electrical contact elements can be provided in each case as contact fingers that are arranged around the middle opening 32. A sealing arrangement whereby fluid is prevented from flowing into electrical contact elements 13, 14 is provided by way of the product seal having the sealing lips 15, 16 that lie against the product 5, and the housing seal 17 between the holding parts 41, 42. The housing seal 17 can be attached in a groove on the first holding part 41.

The holding device 31 comprises a hollow chamber 50. At least one wall of the hollow chamber 50 is provided by the first holding part 41. At least one further wall of the hollow chamber 50 is provided by the second holding part 42. A vacuum power source 58, by way of example a pump, is connected to the hollow chamber 50 by way of a line 59 and a connector on the holding device 31. The holding device 31 comprises integrated ducts that connect the hollow chamber 50 to the connector. A force is generated by way of generating a vacuum in the hollow chamber 50, which force fastens the first holding part 41 and the second holding part 42 to one another. In order to maintain the vacuum, the housing seal 17 and a further seal 49 seal the hollow chamber 50 in order to prevent an inflow of gas and treatment fluid. The vacuum is generated between the holding parts, not between the product and holding device. In order to maintain the vacuum, the vacuum chamber of the holding device can be closed off, for example by way of a valve.

In order to maintain a sufficient vacuum, it can be necessary for the holding device to provide a vacuum reservoir. The hollow chamber 50 can be provided correspondingly large for this purpose. Alternatively, a separate reservoir in the form of a further hollow chamber can be connected to the hollow chamber 50. This further hollow chamber can be provided as non-lockable with respect to the hollow chamber 50. In addition, the further hollow chamber can comprise a connection that can be coupled to a vacuum power source. The entire vacuum area of the holding device can be closed off by way of a valve between the separate reservoir and the coupling in such a manner that in the decoupled state the vacuum in the holding device is maintained.

The hollow chamber 50 can be equipped with a corresponding vacuum sensor in order for example to be able to detect in good time an unacceptable failure of the vacuum.

By virtue of the fact that a vacuum is used in order to generate a force, it is not necessary to provide any resilient elements for the purpose of transferring the current from one holding part to the other holding part and/or mechanical locking elements that push the two holding parts 41, 42 against one another. This renders possible an embodiment of the holding parts 41, 42 in such a manner that the holding parts comprise surfaces along which the holding parts 41, 42 lie against one another. The first holding part 41 therefore comprises a first metal body 43 having an exterior surface 44. The second holding part 42 comprises a second metal body 46 having an exterior surface 47. The holding parts 41, 42 lie in a planar manner against one another of the other at least along the surfaces 44, 47 of the metal body. An electrically conductive connection between the two holding elements 41, 42 can also be produced in this manner. If an electrical connector element 2 for a current or voltage supply is only attached to one of the holding parts 41, 42, an electrically conductive connection to the electrical contact elements of the other holding part can be produced by way of the metal body 43, 46. The first metal body 43 can be connected in an electrically conductive manner to the first electrical contact elements 13 by way of the contact ring 18. The second metal body 46 can be connected in an electrically conductive manner to the second electrical contact elements 14 by way of the contact ring 19. The metal bodies 43 and 46 can comprise the feature that they are used simultaneously in the treatment state both to produce a direct electrical contact to one another and also as a stop to limit the movement of the first holding part 41 and second holding part 42 towards one another, and therefore to limit the contact force of the contact elements on the product.

The first holding part 41 can comprise an insulating component 45 that covers the exterior of the first metal body 43. The second holding part 42 can comprise an insulating component 48 that covers the exterior of the second metal body 46. Alternatively, the metal bodies 43, 46 can also be provided with an electrically insulating coating on the exterior surfaces.

In order to fasten the product 5 to the holding device 31 having the holding parts 41, 42, the product can be placed between the holding parts 41, 42. The vacuum power source 58 is activated in order to generate a vacuum in the hollow chamber 50. In order to remove the product, the vacuum is reduced, by way of example, to ambient pressure and the holding parts 41, 42 are detached from one another. These steps can be performed automatically in each case.

Figure 7:
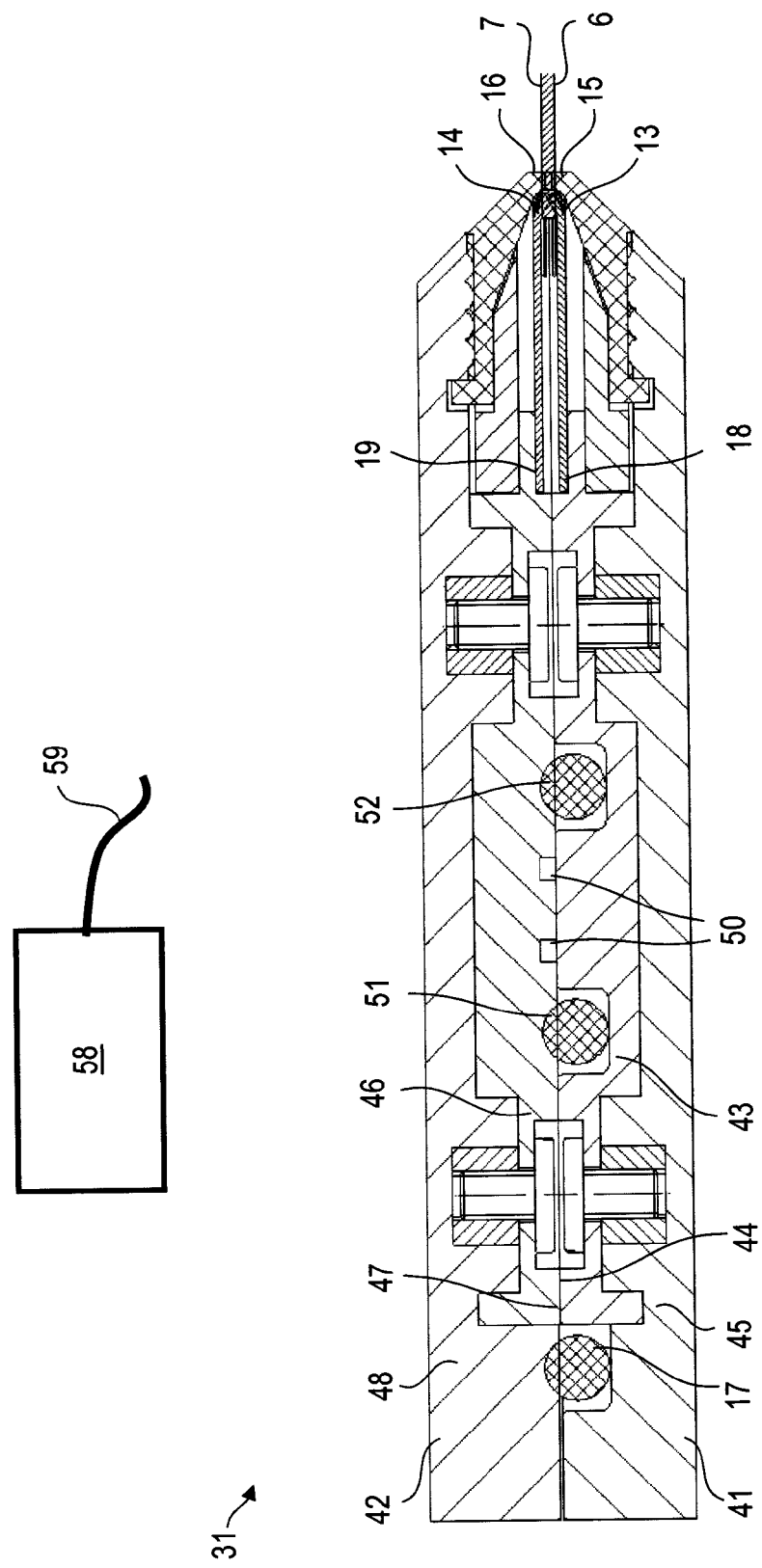
FIG. 7 is a partial sectional view of a holding device in accordance with an exemplary embodiment in the treatment state.

FIG. 7 is a partial section view that illustrates the holding device 31 having a first holding part 41 and a second holding part 42 in a border area of the product 5. The first holding part 41 and the second holding part 42 comprise an embodiment that fundamentally corresponds to the embodiment that is described with reference to FIG. 6. However, in the case of the holding device 31 shown in FIG. 7, a separate third seal 51 and fourth seal 52 are provided in addition to the product seal having the sealing lips 15, 16 and the housing seal 17, which third and fourth seals prevent gas from flowing into the hollow chamber 50. In the case of the embodiment that is illustrated in FIG. 7 it is not necessary for the housing seal 17 to also provide a sealing arrangement in order to prevent the inflow of gas. The further features and functioning mode of the holding device 31 shown in FIG. 7 correspond to the features and functioning modes that are described with reference to FIG. 6.

Alternatively or in addition to the use of a vacuum, the holding device 31 can comprise a different device for exerting a force, which fastens the two holding parts to one another. For example, magnetic forces can be used.

Figure 8:
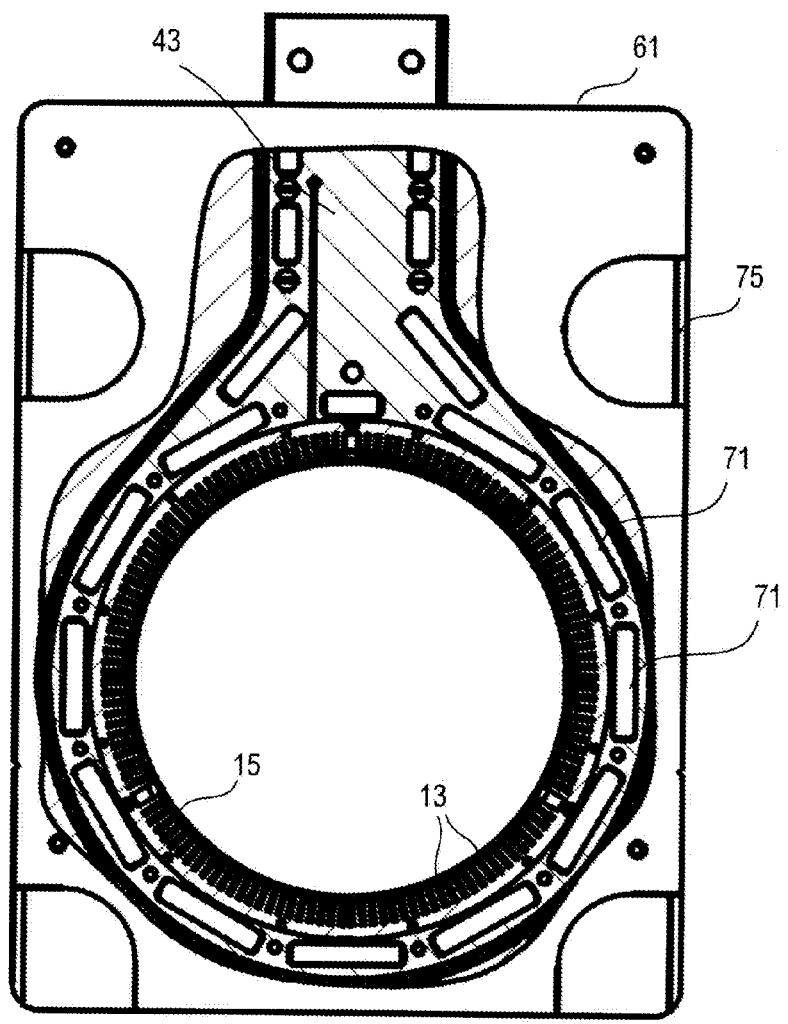
FIG. 8 is a partially exploded plan view of a first holding part of a holding device in accordance with an exemplary embodiment.
Figure 9:
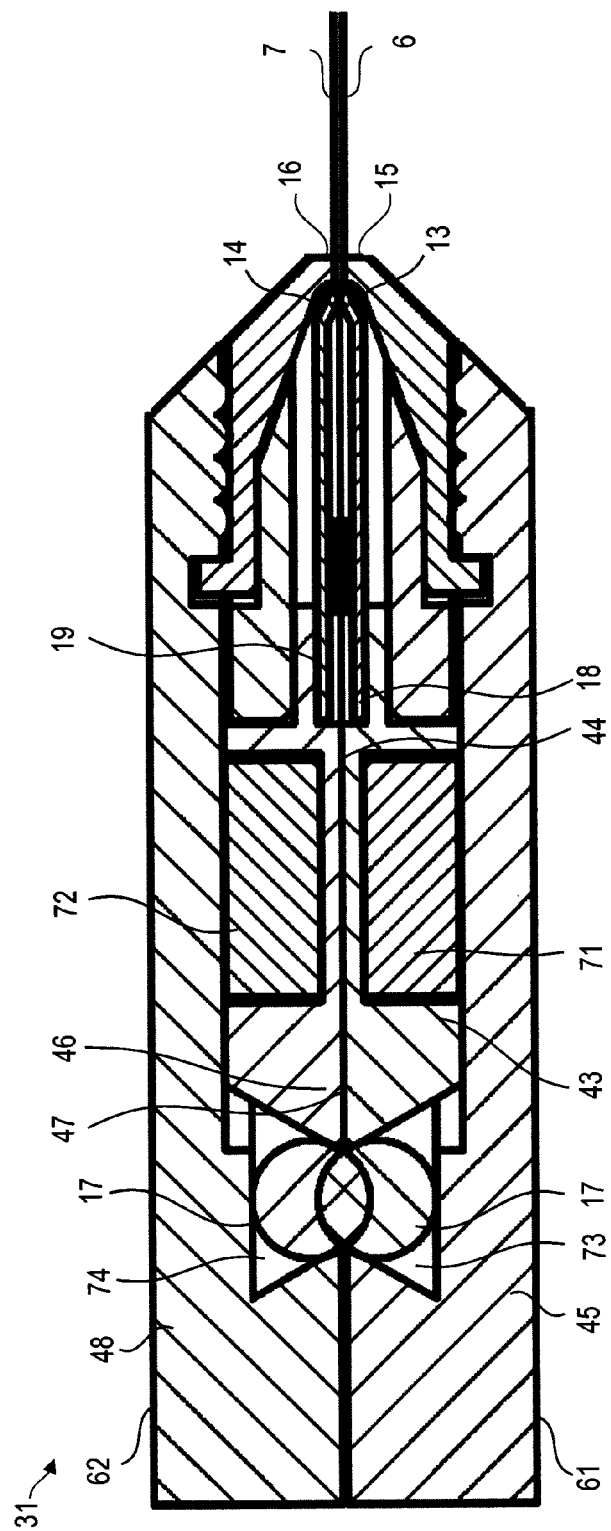
FIG. 9 is a partial sectional view of a holding device in accordance with an exemplary embodiment in the treatment state.

FIG. 8 is a partially exploded plan view of a first holding part 61 of a holding device of this type and FIG. 9 is a partial sectional view that illustrates the holding device 31 having the first holding part 61 and a second holding part 62 in a border area of the product 5. As in the corresponding embodiments that are described with reference to FIGS. 1 to 7, the first electrical contact elements 13 contact a first side 6 of the product. Second electrical contact elements 14 contact a second side 7 of the product. The first and second electrical contact elements can be provided in each case as contact fingers that are arranged around the middle opening 32. A sealing arrangement of the electrical contact elements 13, 14 that prevents a penetration of fluid is achieved by way of the product seal having the sealing lips 15, 16 and the housing seal 17 between the holding parts 61, 62. The housing seal 17 can comprise a sealing ring in a groove 73 on the first holding part 61 and/or a sealing ring in a groove 74 on the second holding part 62.

At least one of the holding parts comprises one or a plurality of magnets. For example, the first holding part 61 can comprise a plurality of magnets 71. The magnets 71 can be embedded in the first holding part 61. The magnets 71 can be arranged around the middle opening 32. The magnets 71 can comprise one or a plurality of permanent magnets. The second holding part 62 can comprise magnets 72 that comprise a corresponding arrangement. In addition at least one of the holding parts 61, 62 can comprise an electromagnet. The electromagnet is arranged and positioned in such a manner that the force that acts overall between the holding parts 61, 62 can be reduced by way of a current flow that is flowing through the electromagnet in a predefined direction.

By virtue of applying a magnetic force that holds the two holding parts 61, 62 against one another, metal bodies of the two holding parts 61, 62 can lie in a planar manner one against the other in a similar manner to that described with reference to FIG. 6 and FIG. 7. The first holding part 61 can thus comprise a first metal body 43 having a surface 44. The second holding part 62 comprises a second metal body 46 having a surface 47. The holding parts 61, 62 lie in a planar manner one against the other at least along the surfaces 44, 47 of the metal body 43, 46. An electrically conductive connection between the two holding parts 61, 62 can be produced in this manner, as was described with reference to FIG. 6. In addition, the metal bodies 43, 46 also produce a mechanical strengthening of the holding parts 61, 62, which reduces the extent to which the holding parts 61, 62 can bend. The magnets 71, 72 can be embedded in corresponding cut-outs in the metal bodies 43, 46.

In order to fasten the product 5 to the holding device 31 having the holding parts 61, 62, the product can be placed against the second holding part 62. The first holding part 61 can be moved closer to the second holding part 62 by means of a machine for closing the holding device closing until the holding parts 61, 62 lie against one another. The machine can engage in recesses 75 on the first holding part 61. In order to remove the product, the machine for closing the holding device can move back into the recesses 75, in order to detach the holding devices 61, 62 from one another. If at least one of the holding parts comprises electromagnets, the electromagnet and/or electromagnets can be supplied with a current, in order to reduce the effective force for the purpose of opening the holding device. The machine for closing the holding device can support the product 5 whilst the holding device is being opened and/or closed.

The holding devices in accordance with all of the described exemplary embodiments can be arranged in such a manner that the electrically conductive parts to which the electrical potential is applied and/or current fed into, are electrically insulated against the treatment fluid. For this purpose, the exterior components of the holding device that surround the electrically conductive materials can comprise an electrically insulating material. The electrically conductive materials, for example the metal bodies of the holding parts, can be provided with an insulating coating.

When using the holding device in accordance with an exemplary embodiment, the holding device together with the product that is held on said holding device can be submerged in a galvanic bath. The holding device having the product that is to be treated is moved relative to the counter electrodes, for example anodes, that are arranged parallel to the product in a treatment container.

Figure 10:
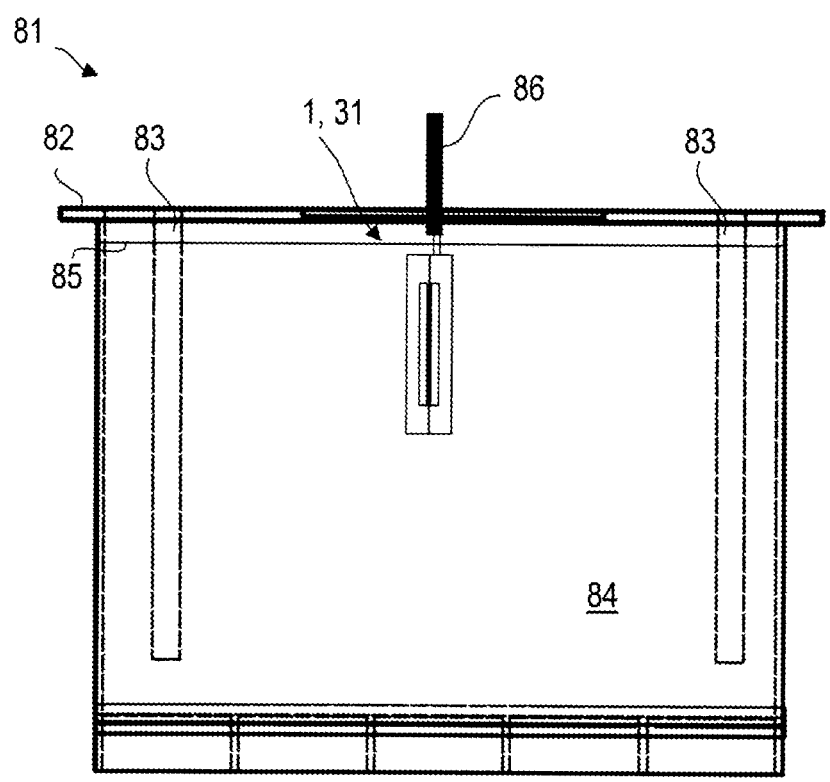
FIG. 10 is a schematic side view of a system for galvanically coating having a holding device in accordance with an exemplary embodiment.

FIG. 10 illustrates a schematic illustration of a system 81 for galvanically coating goods to be treated. The system 81 comprises a treatment container 82, in which a galvanic bath 84 is filled to a solution level 85. Electrodes 83 can be fastened to the treatment container 82 or to a separate tank in such a manner that they protrude into the galvanic bath 84. The holding device 1 or 31 in accordance with an exemplary embodiment is attached to a support 86 that is mounted in a movable manner, so that the holding device can be submerged in the galvanic bath 84 and afterwards pulled out of the galvanic bath 84. The support 86 can also comprise a voltage or current supply line that is coupled to the connector element 2 of the holding device.

Modifications of the exemplary embodiments that are described in detail and illustrated in the figures can be rendered possible in the case of further exemplary embodiments. In particular, other mechanisms can be used alternatively or additionally in order to fasten the holding parts of the holding device to one another. The device for exerting a force can comprise clamps that are attached to an exterior side of the holding parts. The device for exerting a force can comprise a snap-action mechanism that can be activated for example by way of compressed air. The holding device can comprise corresponding ducts for the compressed air, similar to the case when using a vacuum. The device for exerting a force can comprise a chain that is guided into a groove in one of the holding parts. The chain comprises openings that can be moved by way of a counter element on the other holding part. The opening can be moved by way of the counter element by way of pulling on the chain so that a force acts between the holding parts. The chain exits the holding device from a position that is arranged above the solution level, even if the product is completely submerged in the galvanic bath. The device for exerting a force can comprise wedges or pins that can be inserted at at least one side of the holding device or at a plurality of sides of the holding device in order to fasten the holding parts to one another. The device for exerting a force is advantageously arranged in such a manner that the process of closing the holding device and the process of opening the holding device can be mechanically automated. The device for exerting the force is in addition in each case advantageously arranged in such a manner that there is no relative movement parallel to the product between the product and those parts of the holding device that lie directly against the product.

Different materials can be used in order to provide electrically conductive connections inside the holding device. For example, the metal body of the holding parts can be made of titanium or can comprise titanium.

The holding devices and methods in accordance with the different exemplary embodiments can be used during the treatment of products, for example to galvanically coat both sides of products that comprise electrically conductive surfaces. The holding devices are also suitable for and arranged for the purpose of simultaneously treating of only one side of two products. For this purpose, two products of an identical shape are held back to back and otherwise held in the above described manner. A spacing element, for example an elastic spacing element, for example in the form of a seal, can be positioned between the two products at their exterior edges. It is preferred that the spacing element on the product is precisely opposite the contact elements at the sites where they contact the product.

The contact elements that can be provided as a part of a contact ring and/or contact frame are advantageously provided in a resilient manner and can even be interchangeable. As a consequence, depending upon the requirements of the product, which for example can be different with respect to thickness or electrically conductive surfaces, the suitable contact force can be exerted by way of contact elements. For this purpose, the contact frame (for example a contact ring) is interchangeable as a part of the holder. The different contact frames can be similar in their exterior contours. The contact fingers of the different contact frames can differ above all with respect to the length of the contact elements.

All of the exemplary embodiments that are described have advantageous centring elements, in order to position the product precisely in the holder. This product centring can also be used to centre a spacing element between two products.

LIST OF REFERENCE NUMERALS

1 Holding Device
2 Connector element
5 Product
6 First Side
7 Second Side
11 First Holding Part
12 Second Holding Part
13 First Electrical Contact Element
14 Second Electrical Contact Element
15,16 Sealing Lips of the Product Seal
17 Housing Seal
18,19 Contact Ring, Contact Frame
20 Cover Ring
21 Protrusion
22 Opening
23 Receiving device
24 Locking Element
25 Cut-out
25a Distance Element
25b Limiting Surfaces
26 Closing Ring
26a Support Ring
27 Guide Elements
28 Slot
29 Metal Body
30 Exterior Seal
31 Holding Device
32 Middle Opening
41 First Holding Part
42 Second Holding Part
43 Metal Body
44 Bearing Surface
45 Insulating Component
46 Metal Body
47 Bearing Surface
48 Insulating Component
49 Third Seal
50 Hollow Chamber
51 Third Seal
52 Fourth Seal
58 Vacuum Power Source
59 Line
61 First Holding Part
62 Second Holding Part
71,72 Magnet
73,74 Groove
81 Treatment System
82 Treatment Container
83 Electrode
84 Galvanic Bath
85 Solution Level
86 Support

The invention claimed is:
1. Holding device for a galvanic treatment of both sides of a product, wherein the holding device comprises:
   a first holding part having at least one first electrical contact element for establishing a contact with a first side of the product, and
   a second holding part having at least one second electrical contact element for establishing a contact with a second side of the product, which second side lies opposite the first side,
   wherein the first holding part and the second holding part are arranged in such a way that they can be fastened to one another in a detachable manner for the purpose of holding the product,
   wherein a product seal and a housing seal in a treatment state provide a sealing arrangement to prevent the pen- etration of fluid into the at least one first electrical contact element and the at least one second electrical contact element, wherein the product seal comprises a first sealing lip that is attached to the first holding part and a second sealing lip that is attached to the second holding part, and wherein the at least one first electrical contact element and the at least one second electrical contact element are arranged between the product seal and the housing seal, and wherein the first holding part and the second holding part each comprise a middle opening such that the first side and the second side of the product are galvanically treated simultaneously.

2. Holding device as claimed in claim 1, which comprises a device for exerting a force, which device is arranged for the purpose of fastening the first holding part and the second holding part to one another.

3. Holding device as claimed in claim 2, wherein the device for exerting a force comprises at least one hollow chamber and a vacuum power source, wherein at least one wall of the hollow chamber is provided by the first holding part, and at least one further wall of the hollow chamber is provided by the second holding part.

4. Holding device as claimed in claim 3, wherein the holding device comprises a third seal that in the treatment state prevents fluid from flowing into the hollow chamber.

5. Holding device as claimed in claim 2, wherein the device for the purpose of exerting a force comprises at least one magnet.

6. Holding device as claimed in claim 2, wherein the first holding part comprises a first metal body and the second holding part comprises a second metal body, which metal bodies lie in a planar manner one against the other if the device for exerting a force fastens the first holding part and the second holding part to one another.

7. Holding device as claimed in claim 2, wherein the device for exerting a force comprises a mechanical locking mechanism.

8. Method for treating a product that is to be galvanically coated, comprising:
fastening the product to a holding device, which comprises a first holding part having at least one first electrical contact element and a second holding part having at least one second electrical contact element, wherein the first holding part and the second holding part are fastened to one another in such a detachable manner that the first electrical contact element lies against a first side of the product, that the second electrical contact element lies against a second side of the product, which second side lies opposite the first side, and that a product seal and a housing seal provide a sealing arrangement to prevent the penetration of fluid into the at least one first electrical contact element and the at least one second electrical contact element, and treating of the product that is held by the holding device with a treatment fluid; wherein the product seal comprises a first sealing lip that is attached to the first holding part and a second sealing lip that is attached to the second holding part, wherein the at least one first electrical contact element and the at least one second electrical contact element are arranged between the product seal and the housing seal, and wherein the first holding part and the second holding part each comprise a middle opening such that the first side and the second side of the product are galvanically treated simultaneously.

9. Method as claimed in claim 8, wherein the holding device together with the product that is held by said holding device is moved relative to the electrodes that are arranged in a galvanic bath.

10. Holding device as claimed in claim 3, wherein the device for the purpose of exerting a force comprises at least one magnet.

11. Holding device as claimed in claim 4, wherein the device for the purpose of exerting a force comprises at least one magnet.

12. Holding device as claimed in claim 3, wherein the first holding part comprises a first metal body and the second holding part comprises a second metal body, which metal bodies lie in a planar manner one against the other if the device for exerting a force fastens the first holding part and the second holding part to one another.

13. Holding device as claimed in claim 4, wherein the first holding part comprises a first metal body and the second holding part comprises a second metal body, which metal bodies lie in a planar manner one against the other if the device for exerting a force fastens the first holding part and the second holding part to one another.

14. Holding device as claimed in claim 5, wherein the first holding part comprises a first metal body and the second holding part comprises a second metal body, which metal bodies lie in a planar manner one against the other if the device for exerting a force fastens the first holding part and the second holding part to one another.

15. Holding device as claimed in claim 3, wherein the device for exerting a force comprises a mechanical locking mechanism.

16. Holding device as claimed in claim 4, wherein the device for exerting a force comprises a mechanical locking mechanism.

17. Holding device as claimed in claim 5, wherein the device for exerting a force comprises a mechanical locking mechanism.

18. Holding device as claimed in claim 6, wherein the device for exerting a force comprises a mechanical locking mechanism.

* * * * *